(12) United States Patent
Gass et al.

(10) Patent No.: US 8,971,055 B2
(45) Date of Patent: Mar. 3, 2015

(54) RESIDENTIAL CIRCUIT BREAKER WITH FLEXIBLE PRINTED CIRCUIT BOARDS

(75) Inventors: Randall James Gass, Cedar Rapids, IA (US); Rodney Powell, Cedar Rapids, IA (US); Nick Campbell, Cedar Rapids, IA (US); Timothy John Luksetich, Marion, IA (US); Roger Wolf, Lisbon, IA (US); Jerry Scheel, Atkins, IA (US)

(73) Assignee: Schneider Electric USA, Inc., Palatine, IL (US)

( * ) Notice: Subject to any disclaimer, the term of this patent is extended or adjusted under 35 U.S.C. 154(b) by 1708 days.

(21) Appl. No.: 12/336,058

(22) Filed: Dec. 16, 2008

(65) Prior Publication Data

US 2010/0149772 A1    Jun. 17, 2010

(51) Int. Cl.
*H05K 7/00* (2006.01)
*H01H 71/12* (2006.01)
*H05K 3/46* (2006.01)
*H01H 1/58* (2006.01)
*H01H 71/08* (2006.01)
*H05K 1/18* (2006.01)

(52) U.S. Cl.
CPC .......... *H01H 71/123* (2013.01); *H05K 3/4691* (2013.01); *H01H 71/125* (2013.01); *H01H 2001/5816* (2013.01); *H01H 2071/086* (2013.01); *H05K 1/189* (2013.01); *H05K 2201/0909* (2013.01); *H05K 2201/09127* (2013.01)
USPC ........................... 361/781; 361/749; 361/115

(58) Field of Classification Search
USPC ......................................... 361/749
See application file for complete search history.

(56) References Cited

U.S. PATENT DOCUMENTS

| | | | |
|---|---|---|---|
| 4,446,500 A | 5/1984 | Grenier et al. | 361/103 |
| 5,008,496 A * | 4/1991 | Schmidt et al. | 174/254 |
| 5,428,190 A * | 6/1995 | Stopperan | 174/261 |
| 5,949,657 A * | 9/1999 | Karabatsos | 361/803 |
| 6,842,325 B2 | 1/2005 | Meehleder et al. | 361/160 |
| 7,170,376 B2 * | 1/2007 | Mills et al. | 335/202 |

* cited by examiner

*Primary Examiner* — William H Mayo, III
*Assistant Examiner* — Hiram E Gonzalez
(74) *Attorney, Agent, or Firm* — Locke Lord LLP

(57) ABSTRACT

A circuit breaker includes a housing, a rigid circuit board, and a flexible circuit board. The rigid circuit board is enclosed within the housing and has a main surface for supporting an electronic component. The flexible circuit board has a first end that is directly attached to an edge of the rigid circuit board.

18 Claims, 5 Drawing Sheets

RESIDENTIAL CIRCUIT BREAKER WITH FLEXIBLE PRINTED CIRCUIT BOARDS

FIELD OF THE INVENTION

This invention is directed generally to electrical circuit breakers in residential load center application, and, more particularly, to a circuit breaker having a flexible printed circuit board for coupling one or more rigid printed circuit boards.

BACKGROUND OF THE INVENTION

Circuit breakers are generally used in residential applications to provide circuit protection for low voltage distribution systems. Electrical circuits or electrical systems are protected by the circuit breakers from electrical overcurrent conditions, such as overload conditions as well as low and high level short circuit or fault current conditions.

Many current circuit breakers include electronic components that are generally mounted on one or more rigid printed circuit boards (also referred to as rigid circuit boards). The rigid circuit boards have a main surface that provides structural support for the electronic components and electrical connections, such as jumper wires and solder connections. The connections are useful in transmitting electrical signals from one rigid circuit board to another rigid circuit board and/or between a rigid circuit board and other electrical components. Because the main surface of the rigid circuit boards is shared by, both, the electronic components and the connections, space considerations on the main surface is critical for proper design and placement of the electronic components.

Thus, one problem associated with this type of rigid circuit boards is that the space available for electronic components can be drastically reduced by the space requirements of the connections. Another problem associated with the connections is that they require hand assembly during electronic module assembly. For example, jumper wires and solder connections can increase manufacturing time and manufacturing costs. Also, jumper wires and solder connections can also reduce the reliability of the board connections (e.g., the greater the number of connections the more likely that a connection may be faulty).

Yet another problem associated with connections is that they are generally individually routed between rigid circuit boards. Assembly of individually routed connections is likely to increase manufacturing time and cost, and is also likely to result in an uncontrolled (and disorganized) routing location. This type of uncontrolled routing location is likely to create problems, for example, during final assembly of the circuit breaker or when components may require replacement.

SUMMARY OF THE INVENTION

In an implementation of the present invention, a circuit breaker includes a housing, a rigid circuit board, and a flexible circuit board. The rigid circuit board is enclosed within the housing and has a main surface for supporting an electronic component. The flexible circuit board has a first end that is directly attached to an edge of the rigid circuit board.

In an alternative implementation of the present invention, a circuit breaker includes a housing, a first rigid circuit board, a second rigid circuit board, and a flexible circuit board. The first rigid circuit board is mounted inside the housing in a first orientation position and has a first surface for mounting a first electronic component. The second rigid circuit board is mounted inside the housing in a second orientation position, and has a second surface for mounting a second electronic component. The flexible circuit board couples the first rigid circuit board to the second rigid circuit board such that the first orientation position of the first rigid circuit board is capable of being in a non-parallel plane relative to the second orientation position of the second rigid circuit board.

Additional aspects of the invention will be apparent to those of ordinary skill in the art in view of the detailed description of various embodiments, which is made with reference to the drawings, a brief description of which is provided below. For example, space typically required on a rigid circuit board surface for wire connector interface is now available for placement of electronic components. In another example, mounting of rigid circuit boards is enhanced by being capable of positioning the rigid circuit boards in different orientations relative to each other via flexible circuit boards.

BRIEF DESCRIPTION OF THE DRAWINGS

The invention may best be understood by reference to the following description taken in conjunction with the accompanying drawings.

DETAILED DESCRIPTION OF THE ILLUSTRATED EMBODIMENTS

Although the invention will be described in connection with certain preferred embodiments, it will be understood that the invention is not limited to those particular embodiments. On the contrary, the invention is intended to include all alternatives, modifications and equivalent arrangements as may be included within the spirit and scope of the invention as defined by the appended claims.

Figure 1:
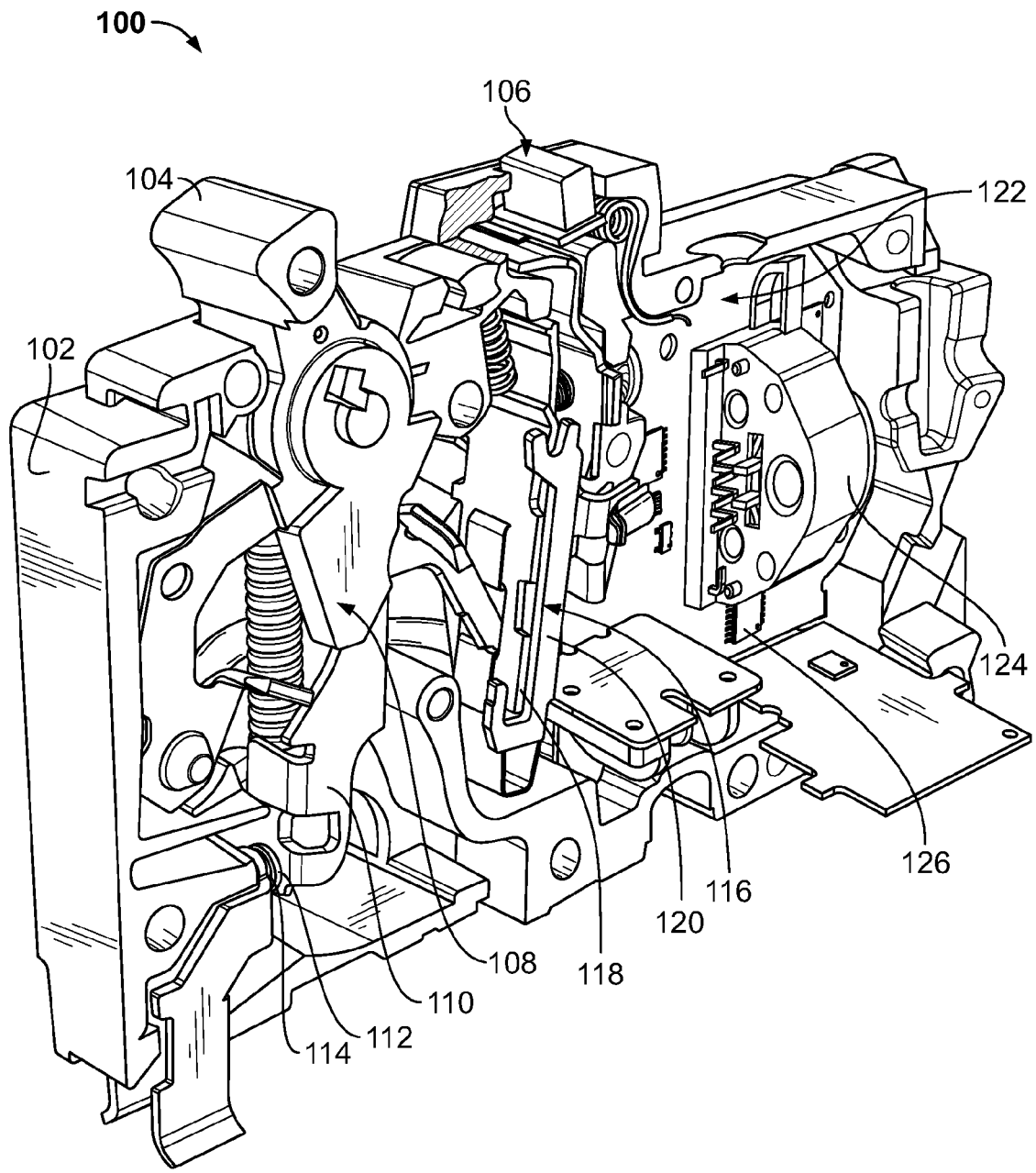
FIG. 1 is a perspective view of a circuit breaker assembly according to one embodiment.

Referring to FIG. 1, a circuit breaker 100 includes a housing 102, a handle 104, and a test button 106. The housing 102 encloses components of the circuit breaker 100 for one or more pole assemblies. For example, the circuit breaker 100 can be a single pole circuit breaker or a multi-pole circuit breaker (e.g., a two-pole circuit breaker).

The handle 104 protrudes through the housing 102 and is generally used for resetting the circuit breaker 100. The handle 104 can also serve as a visual indication of the status of the circuit breaker 100 (e.g., tripped, on, off). The test button 106 is movable between an off position and the test position.

The enclosed components of the circuit breaker 100 includes mechanical components (on the left side) and electrical circuitry (on the right side). The mechanical components include, for example, a handle assembly 108 that is coupled to a movable blade 110 at the end of which is attached a movable contact 112. The movable contact is in direct contact with a fixed contact 114 when the circuit breaker 100 is in an "on" position of the circuit breaker 100 (i.e., when current is allowed to flow through the circuit breaker 100).

A trip mechanism 116 includes a magnetic trip armature 118 and an armature frame 120. In general, the trip mechanism 116 is the mechanism that drives a tripping action such as forcing the movable blade 110, and therefore the movable contact 112, away from the fixed contact 114. For example, the tripping action is caused by the presence of a higher current than the assigned current for the circuit breaker 100 over a specified period of time.

The electrical circuitry includes a circuit board 122 onto which numerous electrical components are mounted. For example, the circuit board 122 includes a sensor 124 and a microprocessor 126.

Figure 2:
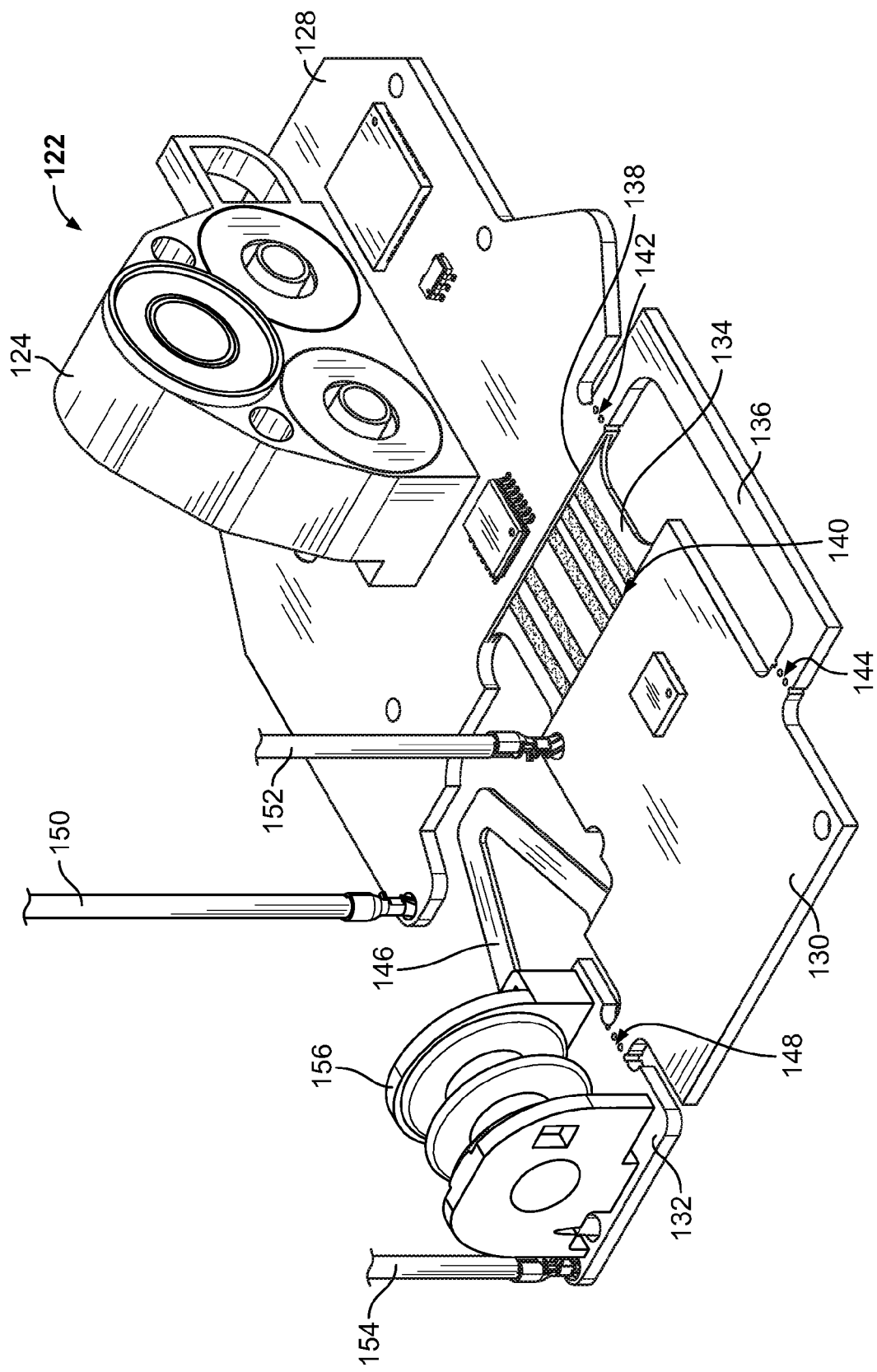
FIG. 2 is a perspective view of an assembly including a plurality of rigid circuit boards and flexible circuit boards.

Referring to FIG. 2, the circuit board 122 includes a first rigid circuit board 128, a second rigid circuit board 130, and a third rigid circuit board 132. As explained in more detail below in reference to FIG. 5, each of the rigid circuit boards 128-132 includes a plurality of material layers.

The first rigid circuit board 128 and the second rigid circuit board 130 are coupled to each other via a first flexible circuit board 134 and a temporary rigid member 136. The first flexible circuit board 134 extends along a first edge 138 and between layers of the first rigid circuit board 128. Similarly, the first flexible circuit board 134 extends along a second edge 140 and between layers of the second rigid circuit board 130.

The temporary rigid member 136 is connected to the first rigid circuit board 128 along a first perforation line 142 and to the second rigid circuit board 130 along a second perforation line 144. The temporary rigid member 136 remains connected to the first rigid circuit board 128 and the second rigid circuit board 130 generally during preliminary stages of manufacturing and assembly of the circuit breaker 100. When a rigid connection between the first rigid circuit board 128 and the second rigid circuit board 130 is no longer necessary, the temporary rigid member 136 is removed by snapping (i.e., bending and pulling) the temporary rigid member 136 off at the first and second perforation lines 142, 144. After removal of the rigid connection, the first rigid circuit board 128 and the second rigid circuit board 130 remain coupled to each other only via the first flexible circuit board 134.

The second rigid circuit board 130 and the third rigid circuit board 132 are coupled to each other via a second flexible circuit board 146 and, temporarily, via a rigid connection along a third perforation line 148. The second rigid circuit board 130 and the third rigid circuit board 132 are decoupled from each other by snapping either one of the second rigid circuit board 130 and the third rigid circuit board 132 along the third perforation line 148. After removal of the rigid connection, the second rigid circuit board 130 and the third rigid circuit board 132 are coupled to each other only via the second flexible circuit board 146.

In general, only electronic components or load lines are mounted directly on a main surface of the rigid circuit boards 128, 130, 132. Other electrical connections (e.g., jumper wires and solder connections), which have traditionally also been included on the surface of rigid circuit boards, are included in the flexible circuit boards 134, 146. For example, the first rigid circuit board 128 supports on the main surface the sensor 124, a first voltage line 150, and other electrical components (e.g., microprocessor, memory, etc.); the second rigid circuit board 130 supports on the main surface a neutral voltage line 152; and the third rigid circuit board 132 supports on the main surface a second voltage line 154 and a trip solenoid 156.

Figure 3:
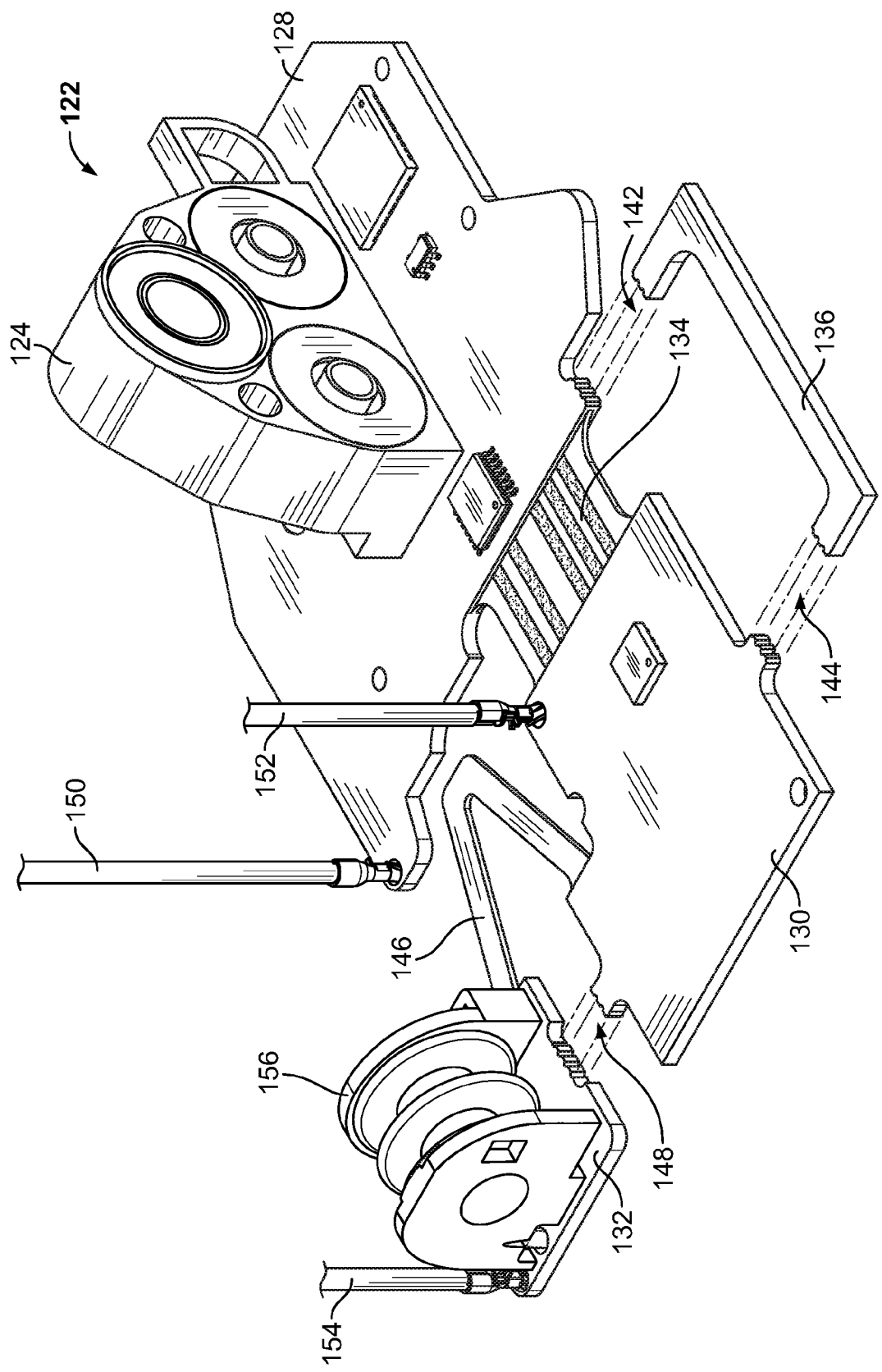
FIG. 3 illustrates the assembly of FIG. 2 after rigid connections between the rigid circuit boards have been removed.

Referring to FIG. 3, the temporary attachments have been removed from the circuit board 122. Specifically, the temporary rigid member 136 has been removed from the first rigid circuit board 128 and the second rigid circuit board 130, along the first and second perforation lines 142, 144. Similarly, the attachment between the second rigid circuit board 130 and the third rigid circuit board 132, along the third perforation line 148, has been removed. Accordingly, each of the rigid circuit boards 128, 130, 132 is now flexible to move independently of the other rigid circuit boards to the extend allowed by the flexible circuit boards 134, 146.

Figure 4:
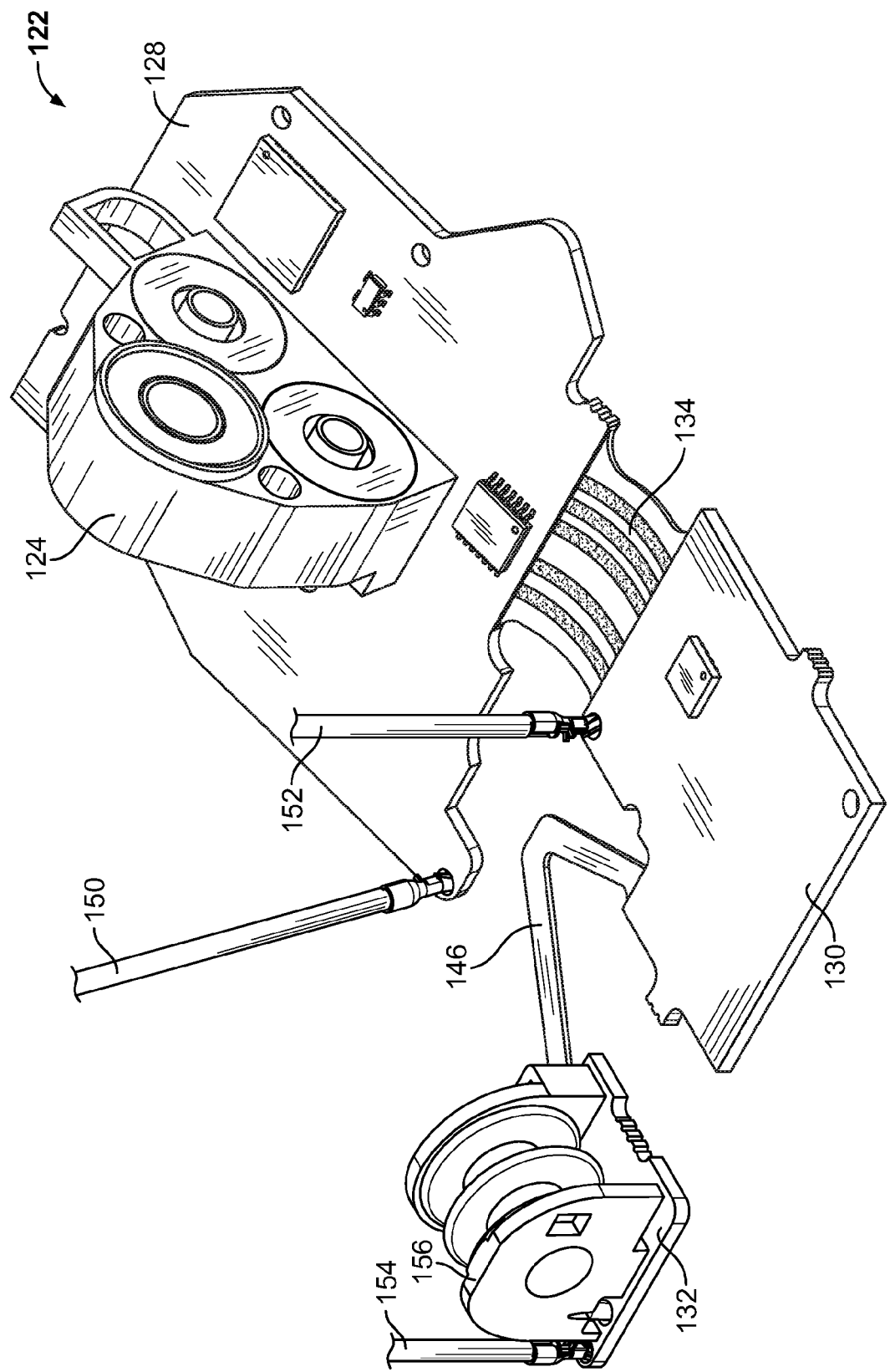
FIG. 4 shows the assembly of FIG. 3 illustrating the rigid circuit boards in non-parallel orientations to each other.

Referring to FIG. 4, the possible movement of the rigid circuit boards 128, 130, 132 is illustrated according to one exemplary embodiment. For example, the first rigid circuit board 128 can now flex (or bend) upwards with respect to either one of the second rigid circuit board 130 and the third rigid circuit board 132. The relative movement of the rigid circuit boards 128, 130, 132 allows beneficial flexibility during manufacturing and assembly of the circuit breaker 100. For example, instead of requiring a larger planar surface for mounting all the electronic components of the three rigid circuit boards 128, 130, 132, smaller planar surfaces can sufficiently (and more easily) accommodate in an individual manner each of the three rigid circuit boards 128, 130, 132. Optionally, the housing 102 can include support features for independently supporting one or more of the three rigid circuit boards 128, 130, 132 in non-parallel orientations relative to each other.

Figure 5:
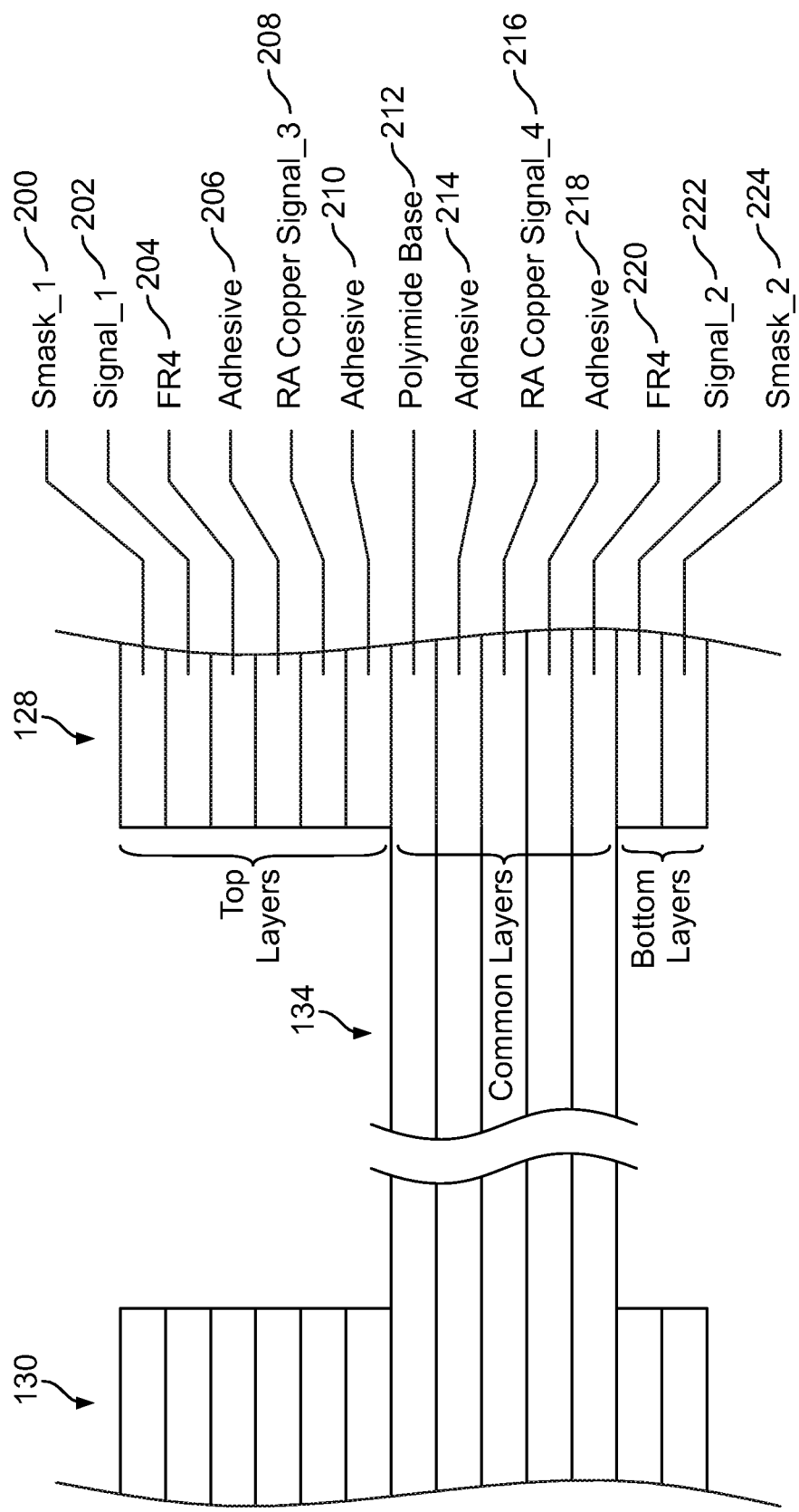
FIG. 5 illustrates a plurality of layers of a rigid circuit board and a flexible circuit board, according to another embodiment.

Referring to FIG. 5, an illustrative embodiment shows exemplary layers included in one or more of the rigid circuit boards 128, 130, 132 and the flexible circuit boards 134, 146. For example purpose, however, reference is made below only to the coupling between the first rigid circuit board 128 and the second rigid circuit board 130 via the first flexible circuit board 134. The first rigid circuit board 128 includes six top layers 200, 202, 204, 206, 208, and 210: an Smask_1 layer 200 (which includes a solder mask and artwork materials); a Signal_1 layer 202 (which includes a signal and artwork materials); a first FR4 layer 204 (which includes a flame retardant material); a first adhesive layer 206; an RA Copper Signal_3 layer 208 (which includes a rolled annealed copper material); and a second adhesive layer 210. The six top layers are layers specific only to the first rigid circuit board 128 and the second rigid circuit board 130 (i.e., they are not included in the flexible circuit board 134).

The next five layers include layers that are common layers between the first and second rigid circuit boards 128, 130 and the first flexible circuit board 134. The common layers include, for example, a polyimide base layer 212, a third adhesive layer 214, an RA Copper Signal_4 layer 216, a fourth adhesive layer 218, and a second FR4 layer 220. One or more of the common layers extend partially or completely within the first and second rigid circuit boards 128, 130. According to one embodiment, the common layers have an overall thickness of up to 0.020 inches. Thus, according to this embodiment, the overall thickness of the first flexible circuit board 134 does not exceed about 0.020 inches.

Below the common layers 212-220, the first rigid circuit board 128 and the second rigid circuit board 130 further include two bottom layers, a Signal_2 layer 222 (similar to the Signal_1 layer 202) and an Smask_2 layer 224 (similar to the Smask_1 layer 200). According to alternative embodiments, the layers can include any combinations and arrangements of materials.

According to one embodiment, the combined overall thickness of the common layers together with the top layers and bottom layers is up to 0.047 inches. Thus, according to this embodiment, the overall thickness of the first rigid circuit board 128 does not exceed about 0.047 inches.

While particular embodiments, aspects, and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A circuit breaker comprising:
   a circuit breaker housing enclosing a two-pole arc fault assembly;
   a handle assembly coupled to a handle for resetting the circuit breaker, the handle protruding from the circuit breaker housing;
   a movable contact coupled to the handle assembly and positioned in direct contact with a fixed contact when the circuit breaker is in an ON position;
   a trip mechanism coupled to the movable contact such that the movable contact and the fixed contact are separated when a tripping action occurs;
   a first rigid circuit board mounted inside the circuit breaker housing in a first orientation position, the first rigid circuit board having a first surface for mounting a first electronic component;
   a second rigid circuit board mounted inside the circuit breaker housing in a second orientation position, the second rigid circuit board having a second surface for mounting a second electronic component, at least one of the first electronic component and the second electronic component being selected from a group consisting of a sensor and a trip solenoid; and
   a flexible circuit board coupling the first rigid circuit board to the second rigid circuit board such that the first orientation position of the first rigid circuit board is capable of being in a non-parallel plane relative to the second orientation position of the second rigid circuit board.

2. The circuit breaker of claim 1, wherein each one of the first rigid circuit board and the second rigid circuit board includes a plurality of layers, the flexible circuit board including a first end that is coextensive with layers of the first rigid circuit board, the flexible circuit board including a second end that is coextensive with layers of the second rigid circuit board.

3. The circuit breaker of claim 1, wherein the flexible circuit board includes a plurality of layers.

4. The circuit breaker of claim 1, wherein an overall total thickness of the first rigid circuit board and the flexible circuit board does not exceed about 0.047 inches.

5. The circuit breaker of claim 1, wherein an overall thickness of the flexible circuit board does not exceed about 0.020 inches.

6. The circuit breaker of claim 1, wherein the first rigid circuit board is rigidly coupled to the second rigid circuit board along a perforated line.

7. The circuit breaker of claim 1, wherein the first rigid circuit board is rigidly coupled to the second rigid circuit board via a temporary member, the temporary member having a generally central section that is separated by a gap from the first rigid circuit board and the second rigid circuit board.

8. The circuit breaker of claim 7, wherein the temporary member is directly attached to each one of the first rigid circuit board and the second rigid circuit board along respective perforated lines.

9. A circuit breaker comprising:
   a circuit breaker housing enclosing a two-pole arc fault assembly;
   a handle assembly coupled to a handle for resetting the circuit breaker, the handle protruding from the circuit breaker housing;
   a movable contact coupled to the handle assembly and positioned in direct contact with a fixed contact when the circuit breaker is in an ON position;
   a trip mechanism coupled to the movable contact such that the movable contact and the fixed contact are separated when a tripping action occurs;
   a rigid circuit board enclosed within the circuit breaker housing and having a main surface for supporting an electronic component, the main surface of the rigid circuit board having an edge; and
   a flexible circuit board having a first end that is directly attached to the edge of the rigid circuit board.

10. The circuit breaker of claim 9, wherein each one of the rigid circuit board and the flexible circuit board includes a plurality of layers.

11. The circuit breaker of claim 10, wherein the plurality of layers include one or more of a solder mask layer, a signal layer, an adhesive layer, and a polyimide base layer.

12. The circuit breaker of claim 10, wherein the rigid circuit board has an overall thickness less than about 0.047 inches and the flexible circuit board has an overall thickness less than about 0.020 inches.

13. The circuit breaker of claim 10, wherein the first end of the flexible circuit board extends completely between two of the rigid layers of the rigid circuit board.

14. The circuit breaker of claim 10, wherein the first end of the flexible circuit board extends partially between two of the rigid layers of the rigid circuit board.

15. The circuit breaker of claim 9, wherein the flexible circuit board has a second end that is directly attached to another rigid circuit board.

16. The circuit breaker of claim 9, wherein the flexible circuit board is V shaped.

17. The circuit breaker of claim 9, wherein the rigid circuit board and the flexible circuit board are mounted in the circuit breaker housing in a non-parallel orientation to each other.

18. The circuit breaker of claim 9, further comprising a temporary rigid member having a first edge attached to an edge of the rigid circuit board and a second edge attached to an edge of another rigid circuit board.

* * * * *